(12) United States Patent
Takao

(10) Patent No.: US 7,622,810 B2
(45) Date of Patent: Nov. 24, 2009

(54) SEMICONDUCTOR DEVICE AND MANUFACTURING METHOD THEREOF

(75) Inventor: Yukihiro Takao, Nitta-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 303 days.

(21) Appl. No.: 10/683,464

(22) Filed: Oct. 14, 2003

(65) Prior Publication Data

US 2004/0137701 A1    Jul. 15, 2004

(30) Foreign Application Priority Data

Oct. 11, 2002  (JP) ............................. 2002-298888
Oct. 11, 2002  (JP) ............................. 2002-298889
Oct. 11, 2002  (JP) ............................. 2002-298890

(51) Int. Cl.
*H01L 23/48* (2006.01)
*H01L 23/52* (2006.01)
*H01L 23/40* (2006.01)

(52) U.S. Cl. ................ 257/774; 257/738; 257/776; 257/780; 257/E23.174; 257/E23.011

(58) Field of Classification Search ............ 257/737, 257/738, 780, 782, E23.174, E23.011, E21.579, 257/773–776, 750–766; 438/613, 637, 638
See application file for complete search history.

(56) References Cited

U.S. PATENT DOCUMENTS

| | | | | |
|---|---|---|---|---|
| 5,024,966 | A * | 6/1991 | Dietrich et al. ............... | 438/23 |
| 5,229,647 | A | 7/1993 | Gnadinger | |
| 5,973,396 | A * | 10/1999 | Farnworth ................... | 257/698 |
| 6,020,217 | A * | 2/2000 | Kuisl et al. .................. | 438/106 |
| 6,025,995 | A | 2/2000 | Marcinkiewicz | |
| 6,130,111 | A | 10/2000 | Ikuina et al. | |
| 6,294,837 | B1 * | 9/2001 | Akram et al. ............... | 257/774 |
| 6,355,981 | B1 | 3/2002 | Richards et al. | |
| 6,392,290 | B1 | 5/2002 | Kasem et al. | |
| 6,400,008 | B1 | 6/2002 | Farnworth | |
| 6,479,900 | B1 * | 11/2002 | Shinogi et al. .............. | 257/758 |
| 6,577,013 | B1 * | 6/2003 | Glenn et al. ................ | 257/777 |
| 6,800,930 | B2 * | 10/2004 | Jackson et al. ............. | 257/700 |
| 6,861,745 | B2 * | 3/2005 | Akram et al. ............... | 257/706 |
| 6,908,845 | B2 * | 6/2005 | Swan et al. .................. | 438/622 |
| 2001/0014524 | A1 * | 8/2001 | Farrar ......................... | 438/613 |
| 2002/0000673 | A1 * | 1/2002 | Farnworth ................... | 257/779 |
| 2002/0019069 | A1 * | 2/2002 | Wada .......................... | 438/69 |
| 2002/0038890 | A1 | 4/2002 | Ohouchi | |
| 2002/0047210 | A1 * | 4/2002 | Yamada et al. .............. | 257/774 |
| 2002/0098619 | A1 * | 7/2002 | Ahn et al. ................... | 438/107 |

(Continued)

FOREIGN PATENT DOCUMENTS

EP     1085570 A2     3/2001

(Continued)

*Primary Examiner*—Michelle Estrada
(74) *Attorney, Agent, or Firm*—Morrison & Foerster LLP

(57) ABSTRACT

Disconnection of wiring and deterioration of step coverage are prevented to offer a semiconductor device of high reliability. A pad electrode formed on a silicon die is connected with a re-distribution layer on a back surface of the silicon die. The connection is made through a pillar-shaped conductive path filled in a via hole penetrating the silicon die from the back surface of the silicon die to the pad electrode.

10 Claims, 19 Drawing Sheets

U.S. PATENT DOCUMENTS

| | | | |
|---|---|---|---|
| 2003/0186486 A1* | 10/2003 | Swan et al. | 438/125 |
| 2004/0018712 A1* | 1/2004 | Plas et al. | 438/612 |

FOREIGN PATENT DOCUMENTS

| | | |
|---|---|---|
| EP | 1171912 | 1/2002 |
| JP | 2001-339057 | 12/2001 |
| JP | 2001-351997 | 12/2001 |
| JP | 2002-512436 | 4/2002 |
| WO | WO-99/40624 A1 | 8/1999 |

\* cited by examiner

DICING LINE REGION
SOLDER BALL FORMING REGION

SEMICONDUCTOR DEVICE AND MANUFACTURING METHOD THEREOF

BACKGROUND OF THE INVENTION

1. Field of the Invention

This invention relates to a BGA (Ball Grid Array) type semiconductor device which has a plurality of ball-shaped conductive terminals.

2. Description of the Related Art

A CSP (Chip Size Package) receives attention in recent years as a three-dimensional mounting technology as well as a new packaging technology. The CSP means a small package having about the same outside dimensions as those of a semiconductor die packaged in it.

A BGA type semiconductor device has been known as a type of CSP. A plurality of ball-shaped conductive terminals made of metal such as solder is arrayed in a grid pattern on one principal surface of the BGA type semiconductor device and is electrically connected with the semiconductor die mounted on the other side of the package.

When the BGA type semiconductor device is mounted into electronic equipment, the semiconductor die and external circuit on a printed circuit board are electrically connected by compression bonding of each of the conductive terminals to each of wiring patterns on the printed circuit board.

Such a BGA type semiconductor device has advantages in providing a large number of conductive terminals and in reducing size over other CSP type semiconductor devices such as an SOP (Small Outline Package) and a QFP (Quad Flat Package), which have lead pins protruding from their sides. The BGA type semiconductor device is used, for example, as an image sensor chip for a digital camera incorporated into a mobile telephone.

FIGS. 30A and 30B show outline structure of a conventional BGA type semiconductor device. FIG. 30A is an oblique perspective figure of a front side of the BGA type semiconductor device. And FIG. 30B is an oblique perspective figure of a back side of the BGA type semiconductor device.

A semiconductor die 104 is sealed between a first glass substrate 102 and a second glass substrate 103 through epoxy resins 105a and 105b in the BGA type semiconductor device 101. A plurality of ball-shaped terminals 106 is arrayed in a grid pattern on a principal surface of the second glass substrate 103, that is, on the back surface of the BGA type semiconductor device 101. The conductive terminals 106 are connected to the semiconductor die 104 through a plurality of second wirings 110. Each of the plurality of second wirings 110 is connected with each of aluminum wirings pulled out from inside of the semiconductor die 104, making each of the ball-shaped terminals 106 electrically connected with the semiconductor die 104.

More detailed explanation on a cross-sectional structure of the BGA type semiconductor device 101 will be given referring to FIG. 31. FIG. 31 shows a cross-sectional view of the BGA type semiconductor devices 101 divided along dicing lines into individual dice.

A first wiring 107 is provided on an insulation film 108 on a surface of the semiconductor die 104. The semiconductor die 104 is bonded to the first glass substrate 102 with the resin 105a. A back surface of the semiconductor die 104 is bonded to the second glass substrate 103 with the resin 105b.

And one end of the first wiring 107 is connected to the second wiring 110. The second wiring 110 extends from the end of the first wiring 107 to a surface of the second glass substrate 103. And the ball-shaped conductive terminal 106 is formed on the second wiring 110 extended onto the second glass substrate 103.

However, there is a possibility that the first wiring 107 and the second wiring 110 are disconnected at a point of contact between them, since the area of the point of contact is very small. Also there is a problem in step coverage of the first wiring 107.

SUMMARY OF THE INVENTION

The invention provides a semiconductor device that includes a semiconductor die, which has a pad electrode formed on its surface, a supporting substrate bonded to a surface of the semiconductor die and a via hole filled with a conductive material. The filled via hole is formed through the semiconductor die and extends from the back surface of the semiconductor die to the pad electrode. The filled via hole may be also formed through a supporting substrate.

The invention also provides a manufacturing method of a semiconductor device. The method includes bonding a supporting substrate to a surface of a semiconductor substrate, which has a pad electrode on its surface, forming a via hole in the semiconductor substrate from a back surface of the semiconductor substrate so as to reach a surface of the pad electrode, filling the via hole with a conductive material, forming a bump electrode on the filled via hole, and dividing the semiconductor substrate into a plurality of semiconductor dice. The filled via hole may be also formed in a supporting substrate. The bump electrode may be also formed on a re-distribution layer.

DETAILED DESCRIPTION OF THE INVENTION

Figure 8A:
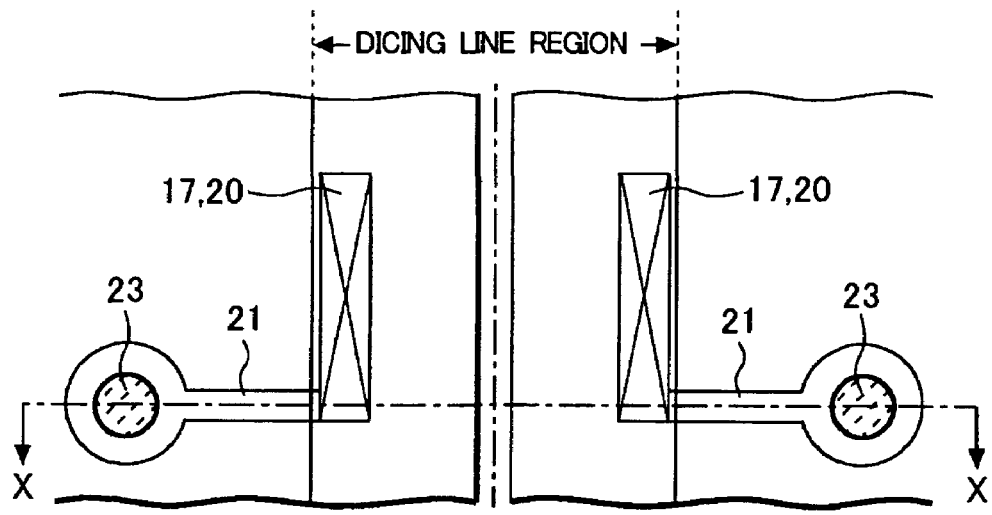
FIG. 8A is a plan view showing the semiconductor device and its manufacturing method according to the first embodiment of this invention.
Figure 8B:
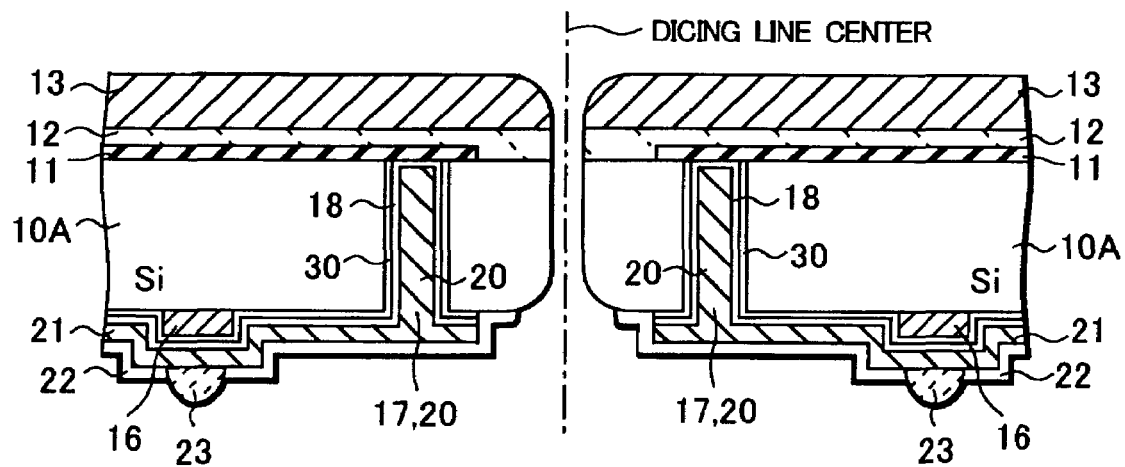
FIG. 8B is a cross-sectional view showing the semiconductor device and its manufacturing method according the first embodiment of this invention.

Next, a first embodiment of this invention will be explained in detail, referring to figures hereinafter. First, a structure of a semiconductor device according to the first embodiment is described referring to FIGS. 8A and 8B. FIG. 8A is a plan view of the semiconductor device around a dicing line looked from a direction facing to a back surface of a silicon die 10A. FIG. 8B is a cross-sectional view showing a section X-X in FIG. 8A. FIG. 8B shows a status of the semiconductor device after dicing a silicon wafer, which has undergone a manufacturing process to be described later, along dicing lines into a plurality of dice (two dice in FIG. 8B).

The silicon die 10A is a CCD (Charge Coupled Device) image sensor chip, for example, and a pad electrode 11 is formed on it. The pad electrode 11 is made by extending a normal pad electrode used for wire bonding to the dicing line region. A surface of the pad electrode 11 is covered with a passivation film (not shown) such as a silicon nitride film. A transparent glass substrate 13 is provided as a supporting substrate, and is bonded to the surface of the silicon die 10A, on which the pad electrode 11 is formed, through a resin layer 12 made of epoxy resin, for example.

And a via hole 17 is made in the silicon die 10A from the back surface of the silicon die 10A to reach the pad electrode 11. A pillar-shaped conductive path 20 made of conductive material such as copper (Cu), for example, is formed to fill the via hole 17. The pillar-shaped conductive path 20 is electrically connected with the pad electrode 11. And the pillar-shaped conductive path 20 is isolated from the silicon die 10A with an insulating layer 30 provided on a sidewall of the via hole 17.

A re-distribution layer 21 is extended from the pillar-shaped conductive path 20 onto the back surface of the silicon die 10A. A solder bump (a bump electrode) 23 is disposed in an opening in a solder mask 22 which is formed on the re-distribution layer 21.

This BGA structure is obtained by forming a plurality of solder bumps 23 at desired locations. Connection between each of the pad electrodes 11 on the silicon die 10A and each of the solder bumps 23 formed on its back side is formed as described above. This embodiment makes the connection less vulnerable to disconnection, or breaking of wiring lines, and improves step coverage, since the connection is made using the pillar-shaped conductive path 20 buried in the via hole 17. In addition, mechanical strength of the connection is increased.

A cushioning material 16 may be provided at a location on the back surface of the silicon die 10A, where the solder bump 23 is to be formed. Providing the cushioning material 16 is to gain a height of the solder bump 23. By doing so, the solder bump 23 and the silicon die 10A are better protected from potential damage caused by stress due to difference in a coefficient of thermal expansion between a printed circuit board and the solder bump 23, when the semiconductor device is mounted on the printed circuit board. The cushioning material 16 may be made of photoresist material, an organic film or metal such as copper (Cu).

Figure 9A:
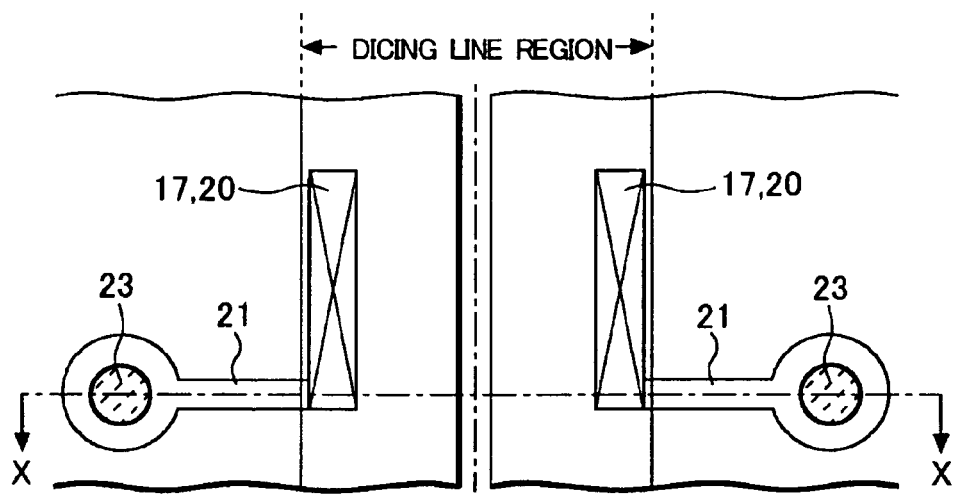
FIG. 9A is a plan view showing the semiconductor device and its manufacturing method according to the first embodiment of this invention.
Figure 9B:
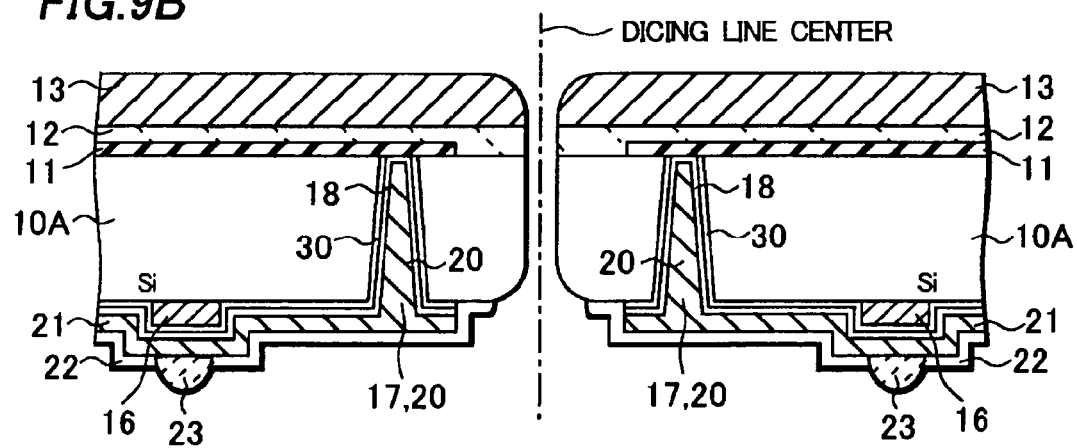
FIG. 9B is a cross-sectional view showing the semiconductor device and its manufacturing method according the first embodiment of this invention.

The via hole 17 is formed in a shape of straight well as shown in FIG. 8B. Not limited to that, the via hole 17 may be tapered down as the via hole 17 goes deeper from the back surface of the silicon die 10A, as shown in FIG. 9B. FIG. 9A is a plan view of the semiconductor device around a dicing line. FIG. 9B is a cross-sectional view showing a section X-X in FIG. 9A. The tapered via hole has an advantage that a seed layer 18 for plating may be formed by sputtering when forming the pillar-shaped conductive path 18 by plating, as will be described later.

Figure 1:
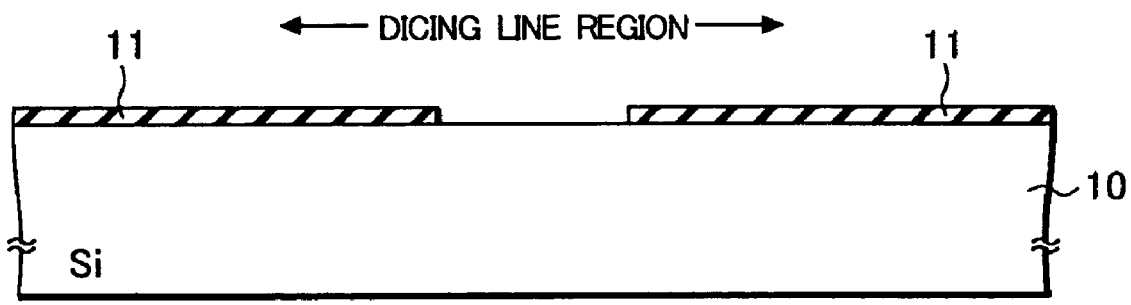
FIG. 1 is a cross-sectional view showing a manufacturing method of a semiconductor device according a first embodiment of this invention.

Next, a manufacturing method of the semiconductor device will be explained hereinafter. It is assumed that a semiconductor integrated circuit (a CCD image sensor, for example, not shown) is formed on a surface of the silicon wafer 10, as shown in FIG. 1. The pad electrode 11, which is described above, is formed on the surface of the silicon wafer 10. The pad electrode 11 is made of metal such as aluminum, aluminum alloy or copper, and is about 1 µm thick.

Figure 2:
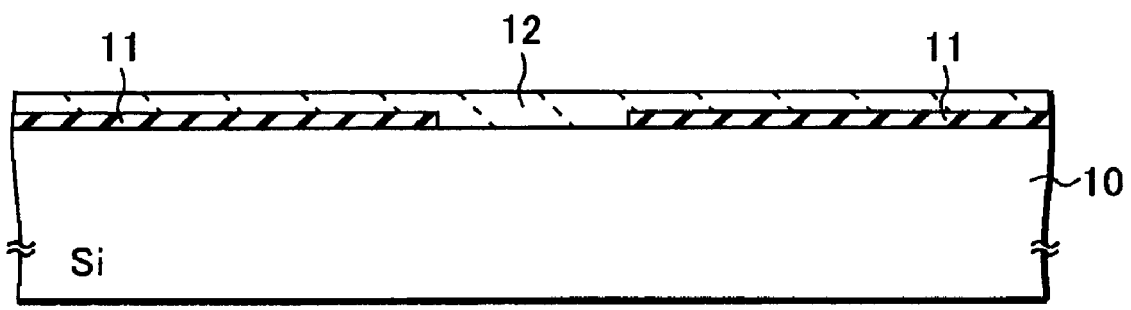
FIG. 2 is a cross-sectional view showing the manufacturing method of the semiconductor device according the first embodiment of this invention.
Figure 3:
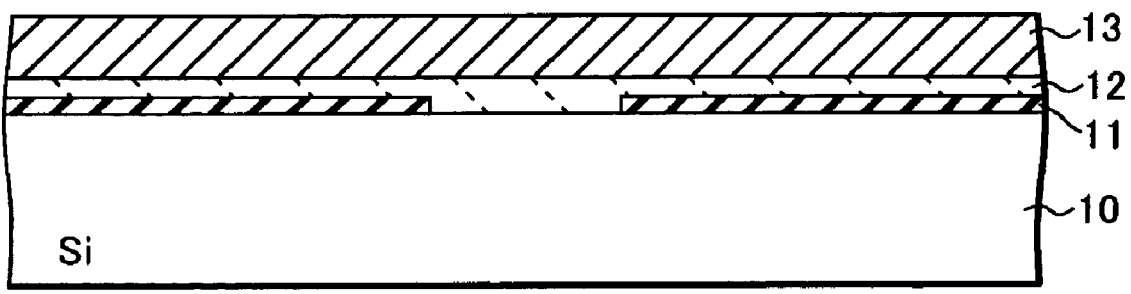
FIG. 3 is a cross-sectional view showing the manufacturing method of the semiconductor device according the first embodiment of this invention.

Next, as shown in FIG. 2, a resin layer 12 made of epoxy resin, for example, is applied. Then the glass substrate 13 is bonded to the surface of the silicon wafer 10 through the resin layer 12, as shown in FIG. 3. The glass substrate 13 works as a material to protect and bolster the silicon wafer 10. After the glass substrate 13 is bonded, thickness of the silicon wafer 10 is reduced to about 100 µm by back grinding. The ground surface may be further etched chemically to refine the surface. Or the back surface may be processed only by dry etching or by wet etching, without back grinding.

Figure 4:
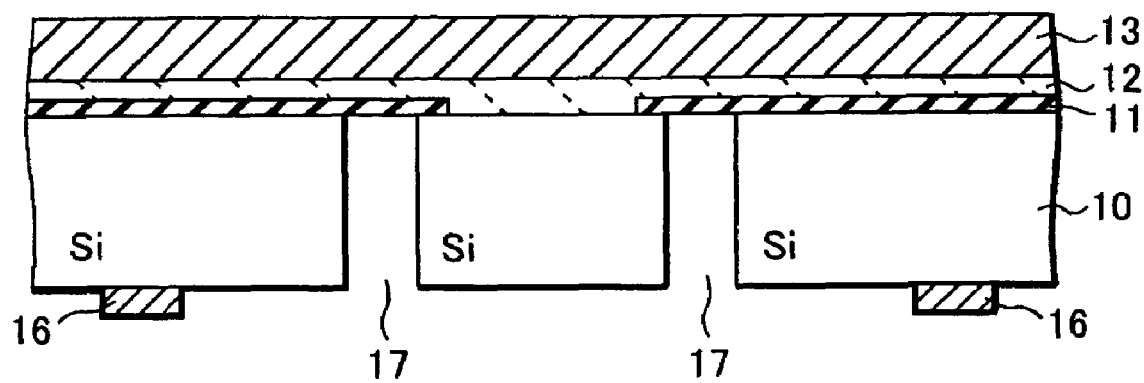
FIG. 4 is a cross-sectional view showing the manufacturing method of the semiconductor device according the first embodiment of this invention.

Then, a cushioning material 16 is formed on the back surface of the silicon wafer 10, which has been back ground, as shown in FIG. 4. The cushioning material 16 is formed at the location where the solder bump 23 is to be formed. The cushioning material 16 is preferably made of photoresist material or an organic film, for example. The cushioning material 16 may be formed when it is required, or may be omitted when application of the semiconductor device does not require it.

Then, the via hole 17 which penetrates the silicon wafer 10 to reach a back surface of the pad electrode 11 is formed. Depth of the via hole 17 is about 100 µm. Its width is about 40 µm and its length is about 200 µm, for example.

The via hole 17 is made with a laser beam or by wet etching or dry etching. The via hole 17 may be formed to make a tapered shape as shown in FIG. 9B, by controlling the laser beam.

Figure 5:
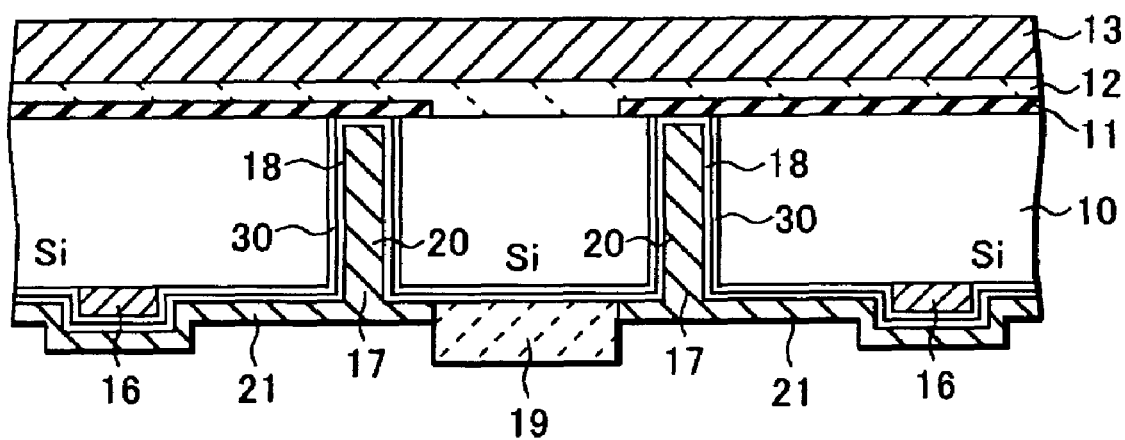
FIG. 5 is a cross-sectional view showing the manufacturing method of the semiconductor device according the first embodiment of this invention.

Next, a process to form the pillar-shaped conductive path 20 and the re-distribution layer 21 will be explained. First, the insulating layer 30 of thickness of about 100 nm is formed on entire surface including inside of the via hole 17 by plasma CVD, as shown in FIG. 5. This is to isolate the pillar-shaped conductive path 20 from the silicon wafer 10. Since the insulating layer 30 is also formed at a bottom of the via hole 17, the insulating layer 30 of that portion is removed by etching to expose the back surface of the pad electrode 11 again.

Next, the seed layer 18 made of copper (Cu) is formed on the entire surface by electroless plating. The seed layer 18 acts as a seed for growth during electrolytic plating, which will be described later. Thickness of about 1 µm is enough for it. Note that the seed layer 18 may be formed by sputtering when the via hole 17 is made in the tapered shape, as mentioned above.

Figure 6:
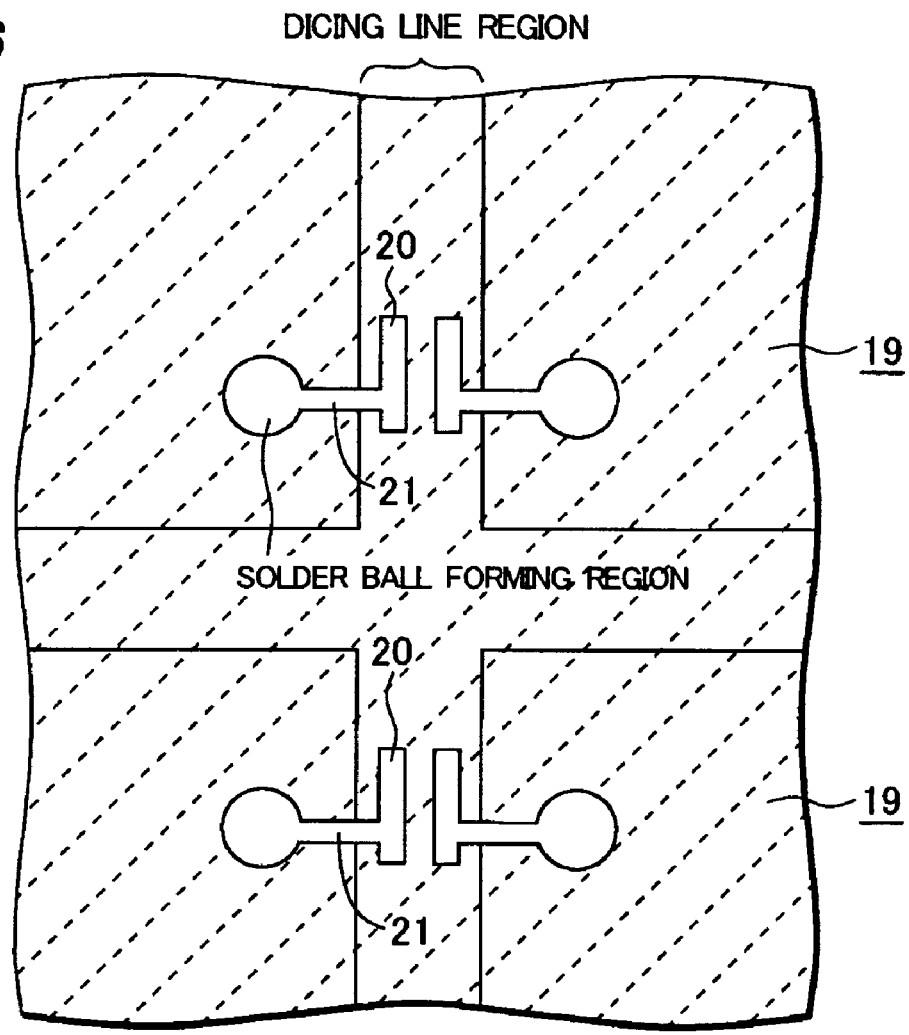
FIG. 6 is a plan view showing the manufacturing method of the semiconductor device according the first embodiment of this invention.

A photoresist layer 19 is formed on a region where the plating is not to be made, prior to the electrolytic plating of copper (Cu). The region on which the photoresist layer 19 is formed is shown as a hutched region in FIG. 6. That is, it is the region excluding regions to form the pillar-shaped conductive path 20, the re-distribution layer 21 and the solder bump 23.

Then the electrolytic plating of copper (Cu) is made to form the pillar-shaped conductive path 20 and the re-distribution layer 21 simultaneously. The pillar-shape conductive path 20 and the pad electrode 11 are electrically connected through the seed layer 18. Although this method is good to reduce the process steps, it has a demerit of not being able to optimize both thickness of plated re-distribution layer 21 and thickness of a plated layer in the via hole 17, since the two thicknesses can not be controlled independently.

With this being the situation, the re-distribution layer 21 may be formed by Al sputtering while the pillar-shaped conductive path 20 is formed by electrolytic plating. After that, a barrier metal (not shown) such as Ni/Au is formed on the re-distribution layer 21 by sputtering. This is to improve electrical connection between the re-distribution layer 21 and the solder bump 23.

Figure 7:
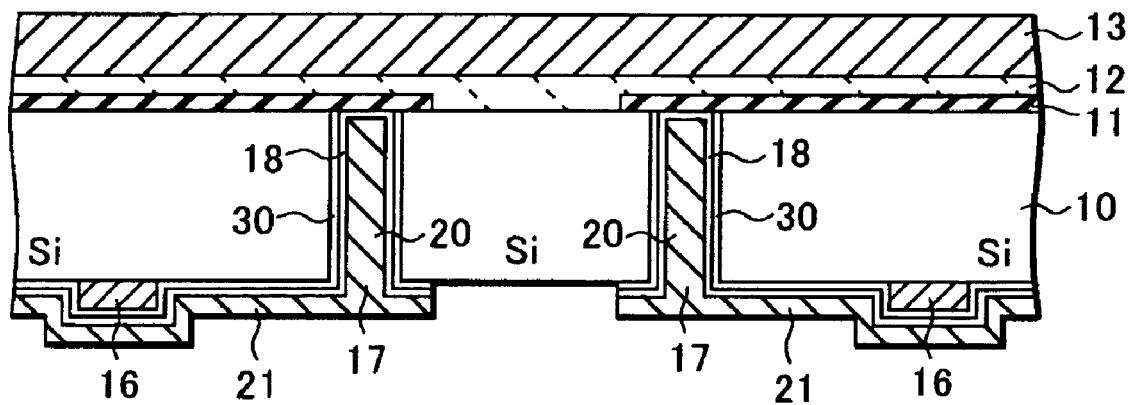
FIG. 7 is a cross-sectional view showing the manufacturing method of the semiconductor device according the first embodiment of this invention.

Then the photoresist layer 19 is removed as shown in FIG. 7. The seed layer 18 remaining under the photoresist layer 19 is removed by etching, using the re-distribution layer 21 as a mask. Although the re-distribution layer 21 is also etched in the process, it causes no problem since the re-distribution layer 21 is much thicker than the seed layer 18.

Next as shown in FIG. 8B, the solder mask 22 is formed on the re-distribution layer 21, solder is printed on a predetermined area on the re-distribution layer 21 using screen printing, and the solder is reflowed by heat treatment to form the solder bump 23. Note that desired number of the re-distribution layer 21 can be formed in desired regions on the back surface of the silicon wafer 10 and that number and regions of the solder bumps 23 can be selected at will.

The silicon wafer 10 is divided along the dicing lines into a plurality of silicon dice 10A. The laser beam may be used in the dicing process. When the laser beam is used in the dicing process, cut surface of the glass substrate 13 may be made tapered so that cracking of the glass substrate 13 is prevented.

Figure 18A:
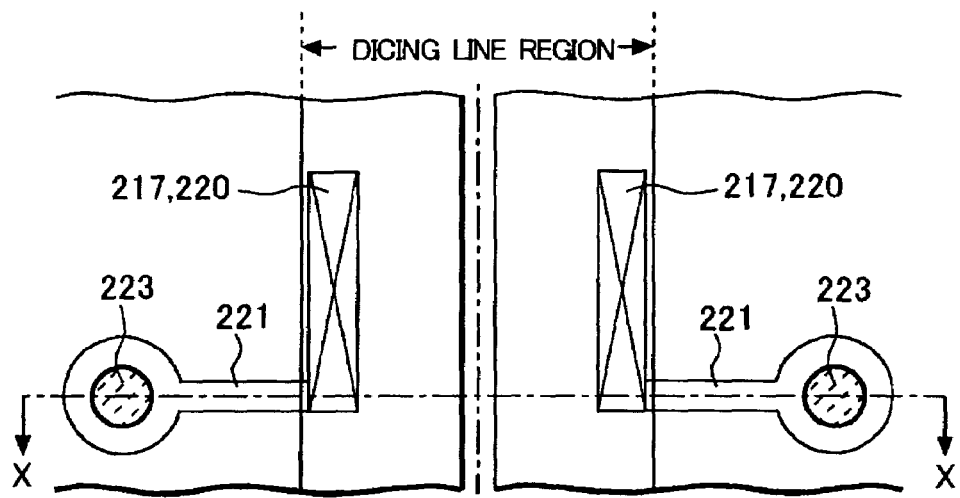
FIG. 18A is a plan view showing the semiconductor device and its manufacturing method according to the second embodiment of this invention.
Figure 18B:
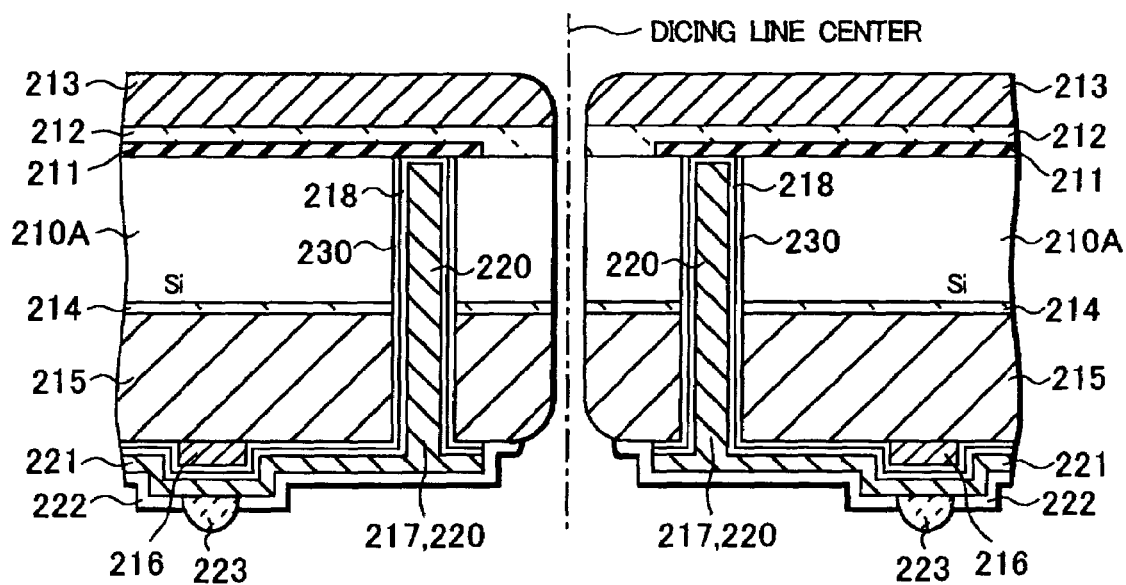
FIG. 18B is a cross-sectional view showing the semiconductor device and its manufacturing method according the second embodiment of this invention.

Next, a second embodiment of this invention will be explained in detail, referring to figures hereinafter. First, a structure of a semiconductor device according to the second embodiment is described referring to FIGS. 18A and 18B. FIG. 18A is a plan view of the semiconductor device around a dicing line looked from a direction facing to a second glass substrate 215. FIG. 18B is a cross-sectional view showing a section X-X in FIG. 18A. FIG. 18B shows status of the semiconductor device after dicing a silicon wafer, which has undergone a manufacturing process to be described later, along dicing lines into a plurality of dice (two dice in FIG. 18B).

The silicon die 210A is a CCD image sensor chip, for example, and a pad electrode 211 is formed on it. The pad electrode 211 is made by extending a normal pad electrode used for wire bonding to the dicing line region. A surface of the pad electrode 211 is covered with a passivation film (not shown) such as a silicon nitride film. A transparent first glass substrate 213 is provided as a supporting substrate, and is bonded to the surface of the silicon die 210A, on which the pad electrode 211 is formed, through a resin layer 212 made of epoxy resin, for example.

A transparent second glass substrate 215 is provided as a supporting substrate, and is bonded to a back surface of the silicon die 210A through a resin layer 214 made of epoxy resin, for example.

And a via hole 217 is made in the second glass substrate 215 and the silicon die 210A from the surface of the second glass substrate 215 to reach the pad electrode 211. A pillar-shaped conductive path 220 made of conductive material such as copper (Cu), for example, is formed to fill the via hole 217. The pillar-shaped conductive path 220 is isolated from the silicon die 210A with an insulating layer 230 provided on a sidewall of the via hole 217.

A re-distribution layer 221 is extended from the pillar-shaped conductive path 220 onto the surface of the second glass substrate 215. A solder bump (a bump electrode) 223 is disposed in an opening in a solder mask 222 which is formed on the re-distribution layer 221.

A BGA structure is obtained by forming a plurality of solder bumps 223 at desired locations. Connection between each of the pad electrodes 211 on the silicon die 210A and each of the solder bumps 223 formed on the surface of the second glass substrate 215 is formed as described above. This invention makes the connection less vulnerable to disconnection and improves step coverage, since the connection is made using the pillar-shaped conductive path 220 buried in the via hole 217. In addition, mechanical strength of the connection is increased.

A cushioning material 216 may be provided at a location on the surface of the second glass substrate 215, where the solder bump 223 is to be formed. Providing the cushioning material 216 is to gain a height of the solder bump 223. By doing so, the solder bump 223 and the second glass substrate 215 are better protected from potential damage caused by stress due to difference in a coefficient of thermal expansion between a printed circuit board and the solder bump 223, when the semiconductor device is mounted on the printed circuit board. The cushioning material 216 may be made of photoresist material, an organic film or metal such as copper (Cu).

Figure 19A:
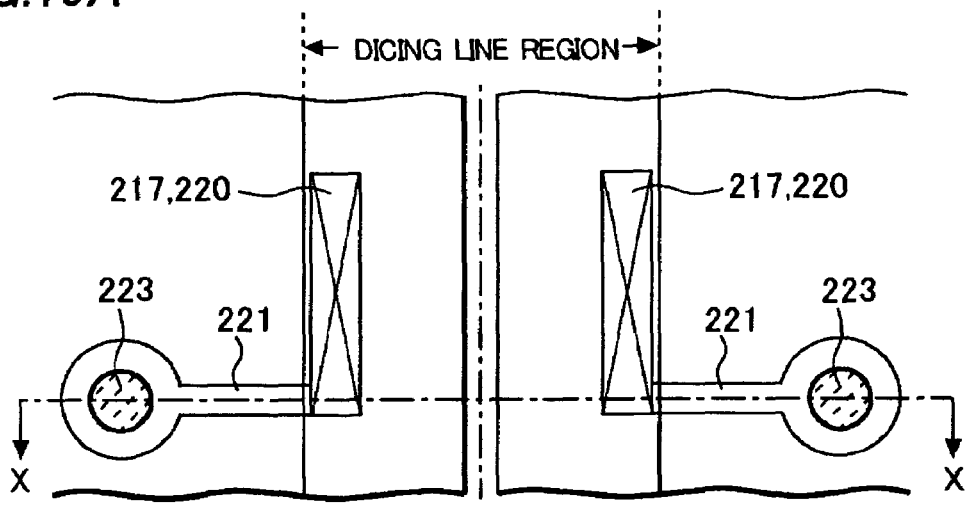
FIG. 19A is a plan view showing the semiconductor device and its manufacturing method according to the second embodiment of this invention.
Figure 19B:
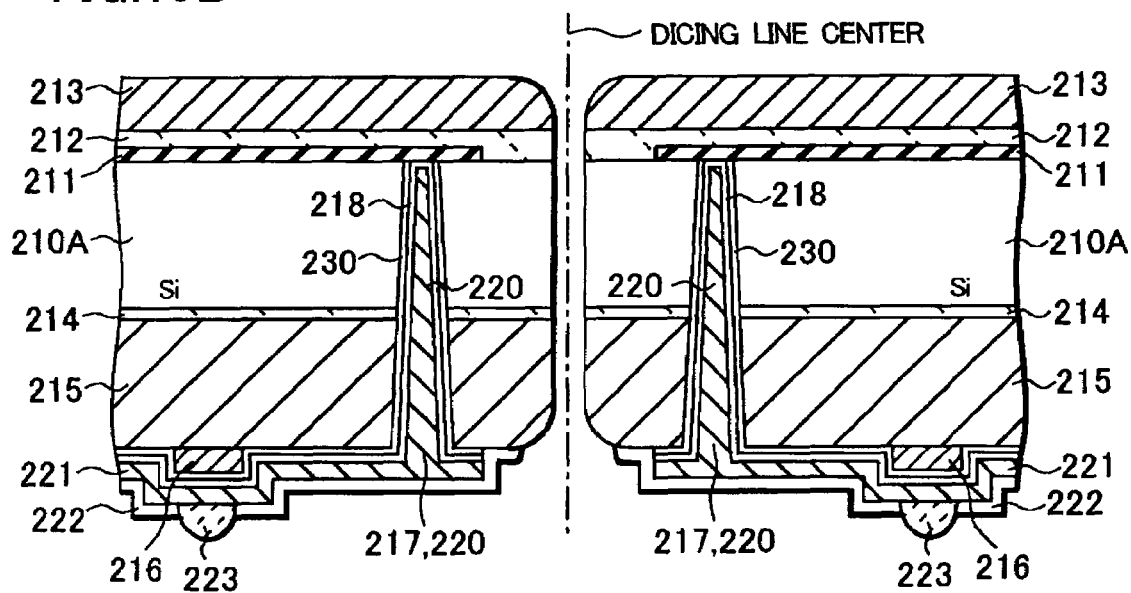
FIG. 19B is a cross-sectional view showing the semiconductor device and its manufacturing method according the second embodiment of this invention.

The via hole 217 is formed in a shape of straight well as shown in FIG. 18B. Not limited to that, the via hole 217 may be tapered down as the via hole 217 goes deeper from the surface of the second glass substrate 215, as shown in FIG. 19B. FIG. 19A is a plan view of the semiconductor device around the dicing line. FIG. 19B is a cross-sectional view showing a section X-X in FIG. 19A. The tapered via hole has an advantage that a seed layer 220 for plating may be formed by sputtering when forming the pillar-shaped conductive path 218 by plating, as will be described later.

Figure 10:
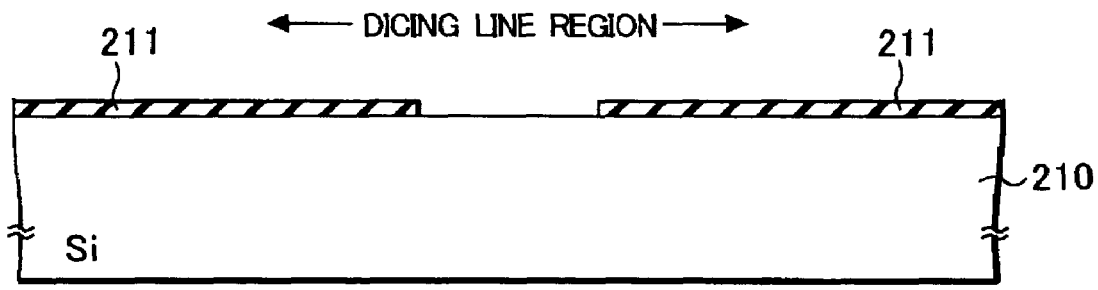
FIG. 10 is a cross-sectional view showing a manufacturing method of a semiconductor device according a second embodiment of this invention.

Next, a manufacturing method of the semiconductor device will be explained hereinafter. It is assumed that a semiconductor integrated circuit (a CCD image sensor, for example, not shown) is formed on a surface of the silicon wafer 210, as shown in FIG. 10. And the pad electrode 211, which is described above, is formed on the surface of the silicon wafer 210. The pad electrode 211 is made of metal such as aluminum, aluminum alloy or copper, and is about 1 µm thick.

Figure 11:
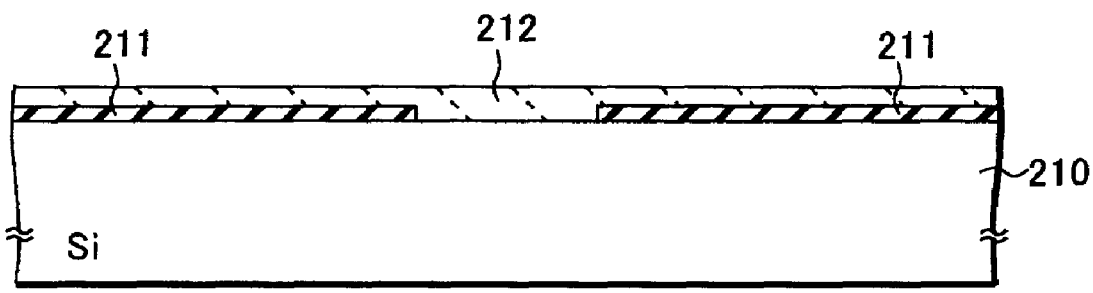
FIG. 11 is a cross-sectional view showing the manufacturing method of the semiconductor device according the second embodiment of this invention.
Figure 12:
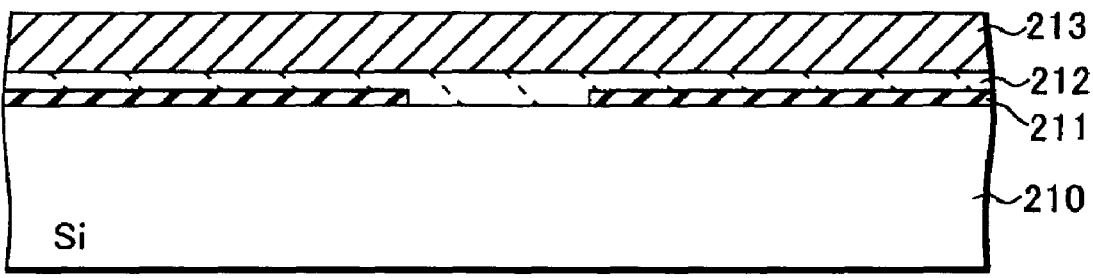
FIG. 12 is a cross-sectional view showing the manufacturing method of the semiconductor device according the second embodiment of this invention.

Next, as shown in FIG. 11, a resin layer 212 made of epoxy resin, for example, is applied. Then the first glass substrate 213 is bonded to the surface of the silicon wafer 210 through the resin layer 212, as shown in FIG. 12. The first glass substrate 213 works as a material to protect and bolster the silicon wafer 210. After the first glass substrate 213 is bonded, thickness of the silicon wafer 210 is reduced to about 100 µm by back grinding. The ground surface may be further etched chemically to refine the surface. Or the back surface may be processed only by dry etching or by wet etching, without back grinding.

Figure 13:
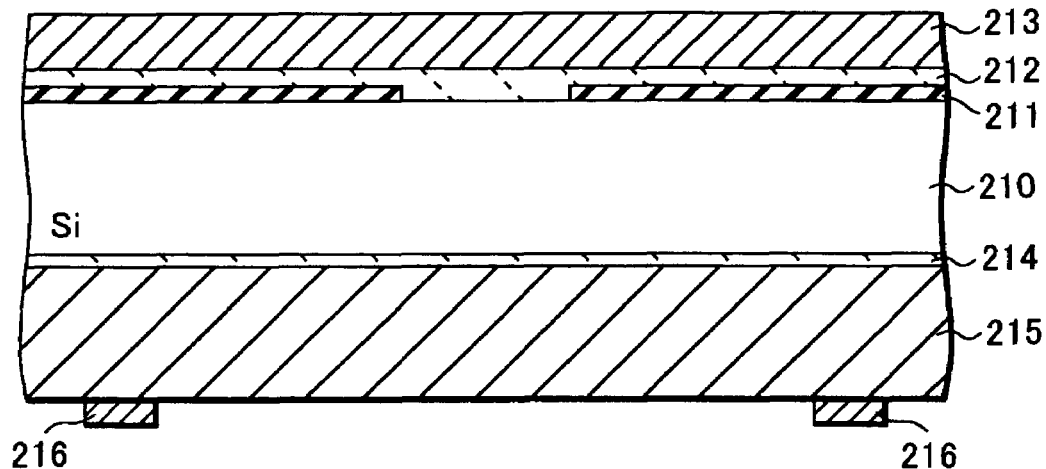
FIG. 13 is a cross-sectional view showing the manufacturing method of the semiconductor device according the second embodiment of this invention.

Next, as shown in FIG. 13, a resin layer 214 made of epoxy resin is applied to the back surface of the silicon wafer 210. The second glass substrate 214 is bonded to the back surface of the silicon wafer 210, using the resin layer 215 as a binder. The second glass substrate 215 is about 100 µm thick. The second glass substrate 215 is to bolster the semiconductor device and make it more resistant to warping.

Furthermore, the cushioning material 216 is formed on the second glass substrate 215. The cushioning material 216 is formed at the location where the solder bump 223 is to be formed. The cushioning material 216 may be formed of photoresist material, an organic film or metal such as copper (Cu) by sputtering. The cushioning material 216 may be formed when it is required, or may be omitted when application of the semiconductor device does not require it.

Figure 14:
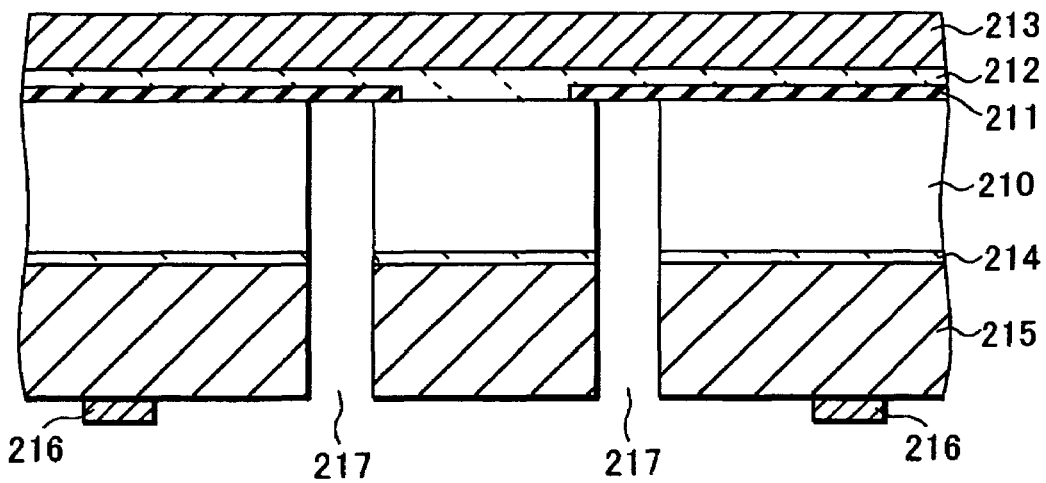
FIG. 14 is a cross-sectional view showing the manufacturing method of the semiconductor device according the second embodiment of this invention.
Figure 15:
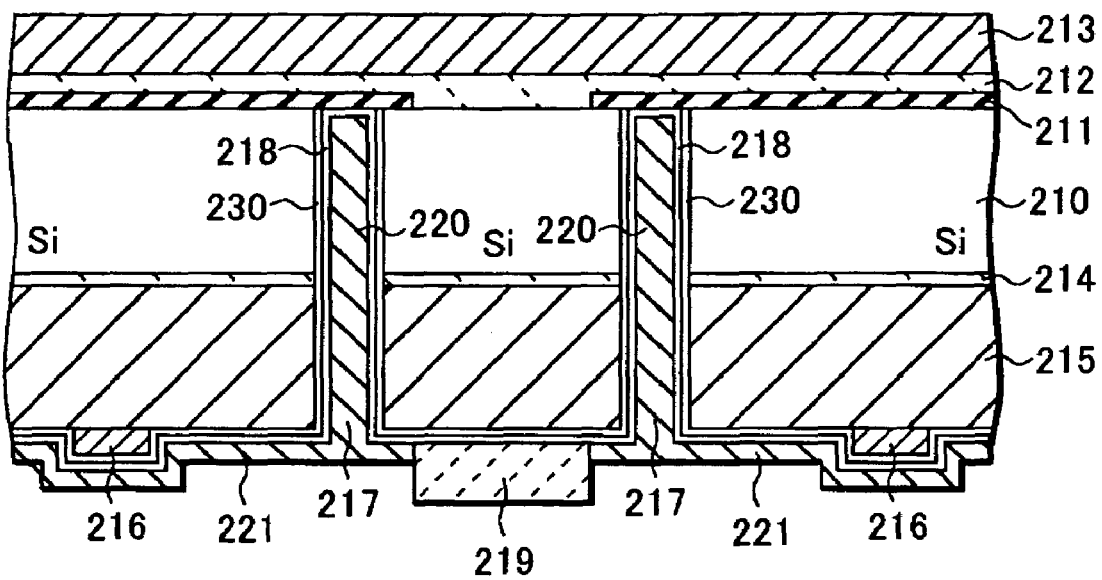
FIG. 15 is a cross-sectional view showing the manufacturing method of the semiconductor device according the second embodiment of this invention.
Figure 16:
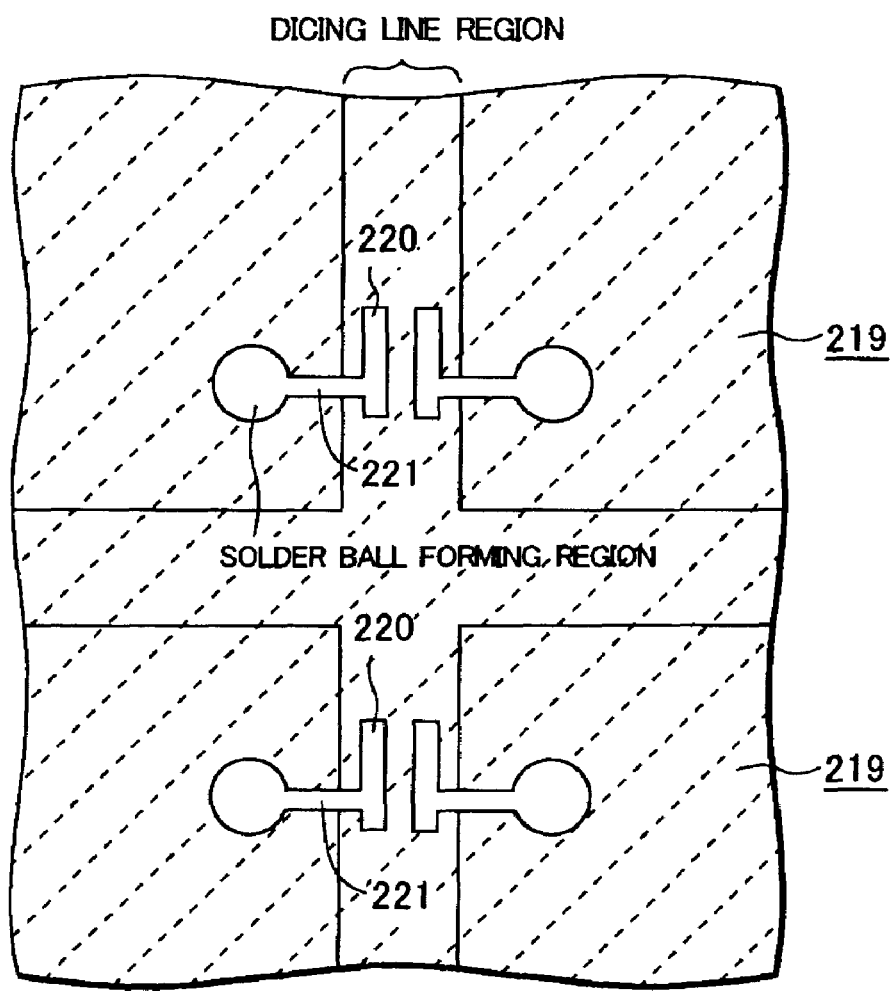
FIG. 16 is a plan view showing the manufacturing method of the semiconductor device according the second embodiment of this invention.
Figure 17:
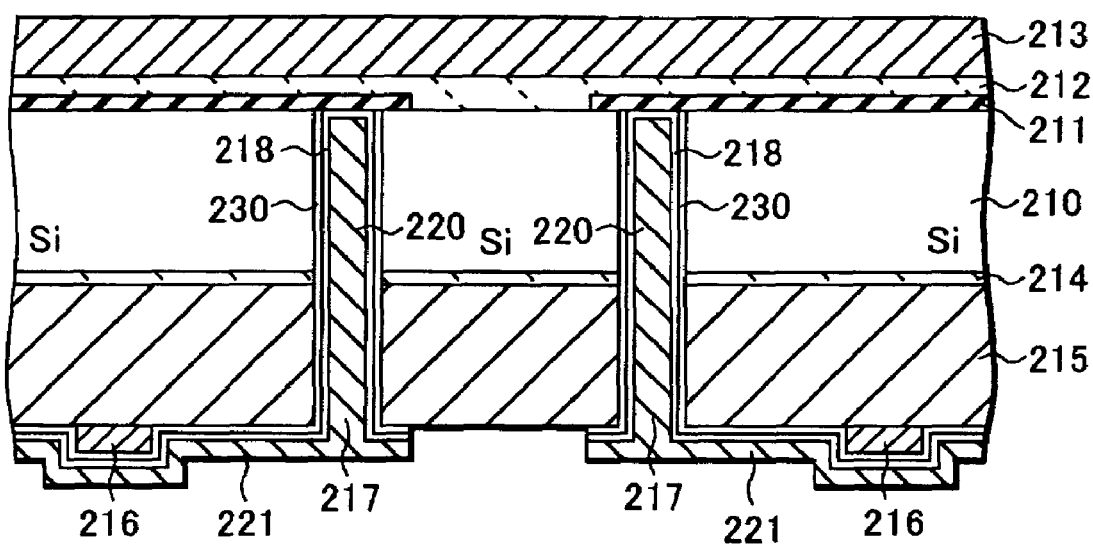
FIG. 17 is a cross-sectional view showing the manufacturing method of the semiconductor device according the second embodiment of this invention.

Next, the via hole 217, which penetrates the second glass substrate 215 and the silicon wafer 210 to reach a back surface of the pad electrode 211, is formed, as shown in FIG. 14. Depth of the via hole 217 is about 200 µm. Its width is about 40 µm and its length is about 200 µm, for example.

Using the laser beam is suitable to form the via hole 217 in the silicon wafer 210, which is deep and penetrating a plurality of layers of different materials. If an etching method using dry etching or wet etching is adopted, each of the different materials composing a layer to be etched requires changing etching gas, complicating the manufacturing process. The via hole 217 may be formed to make a tapered shape as shown in FIG. 19B, by controlling the laser beam.

Then process steps to form the pillar-shape conductive path 220 and the re-distribution layer 221 follow. Since these process steps and the rest of the process steps are the same as in the first embodiment, FIGS. 15-18B are presented omitting explanations.

Figure 28A:
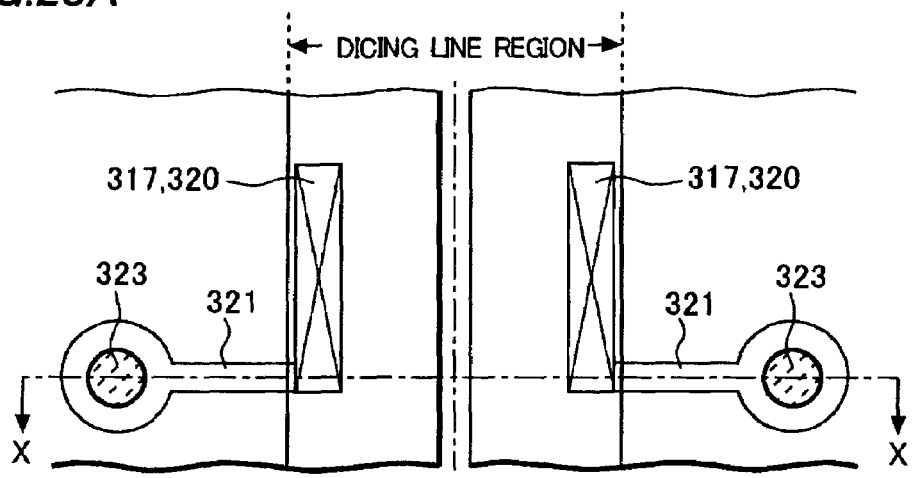
FIG. 28A is a plan view showing the semiconductor device and its manufacturing method according to the third embodiment of this invention.
Figure 28B:
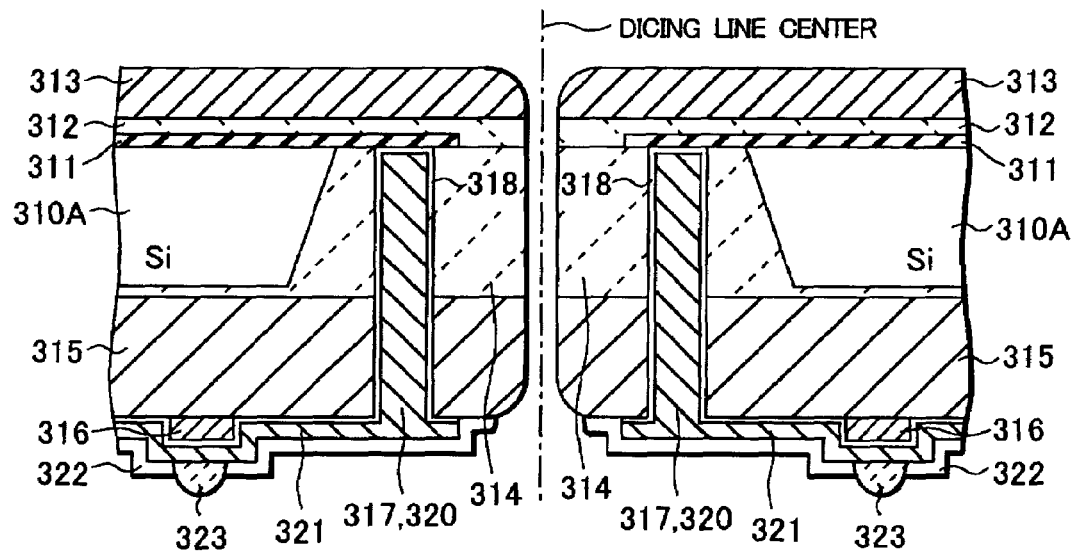
FIG. 28B is a cross-sectional view showing the semiconductor device and its manufacturing method according the third embodiment of this invention.

Next, a third embodiment of this invention will be explained in detail, referring to figures hereinafter. First, a structure of a semiconductor device according to the third embodiment is described referring to FIGS. 28A and 28B. FIG. 28A is a plan view of the semiconductor device around a dicing line looked from a direction facing to a second glass substrate 315. FIG. 28B is a cross-sectional view showing a section X-X in FIG. 28A. FIG. 28B shows status of the semiconductor device after dicing a silicon wafer, which has undergone a manufacturing process to be described later, along dicing lines into a plurality of dice (two dice in FIG. 28B).

The silicon die 310A is a CCD image sensor chip, for example, and a pad electrode 311 is formed on it. The pad electrode 311 is made by extending a normal pad electrode used for wire bonding to the dicing line region. A surface of the pad electrode 311 is covered with a passivation film (not shown) such as a silicon nitride film. A transparent first glass substrate 313 is bonded through a resin layer 312 made of epoxy resin, for example, to a surface of the silicon die 310A, on which the pad electrode 311 is formed.

The side surface of the silicon die 310A and a part of the back surface of the pad electrode 311 are covered with a resin layer 314 made of epoxy resin, for example. The second glass substrate 315 is bonded to a back surface of the silicon die 310A, using the resin layer 314 as a binder.

A via hole 317 is formed in the second glass substrate 315 and the resin layer 314 from the surface of the second glass substrate 315 to reach the pad electrode 311. A pillar-shaped conductive path 320 made of conductive material such as copper (Cu), for example, is formed to fill the via hole 317. A re-distribution layer 321 is extended from the pillar-shaped conductive path 320 onto the surface of the second glass substrate 315. A solder bump (a bump electrode) 323 is disposed in an opening in a solder mask 322 which is formed on the re-distribution layer 321.

A BGA structure is obtained by forming a plurality of solder bumps 323 at desired locations. Connection between each of the pad electrodes 311 on the silicon die 310A and each of the solder bumps 323 formed on the surface of the second glass substrate 315 is formed as described above. This embodiment makes the connection less vulnerable to disconnection and improves step coverage, since the connection is made using the pillar-shaped conductive path 320 buried in the via hole 317. In addition, mechanical strength of the connection is increased.

A cushioning material 316 may be provided at a location on the surface of the second glass substrate 315, where the solder bump 323 is to be formed. Providing the cushioning material 316 is to gain a height of the solder bump 323. By doing so, the solder bump 323 and the second glass substrate 315 are better protected from potential damage caused by stress due to difference in a coefficient of thermal expansion between a printed circuit board and the solder bump 323, when the semiconductor device is mounted on the printed circuit board. The cushioning material 316 may be made of photoresist material, an organic film or metal such as copper (Cu).

Figure 29A:
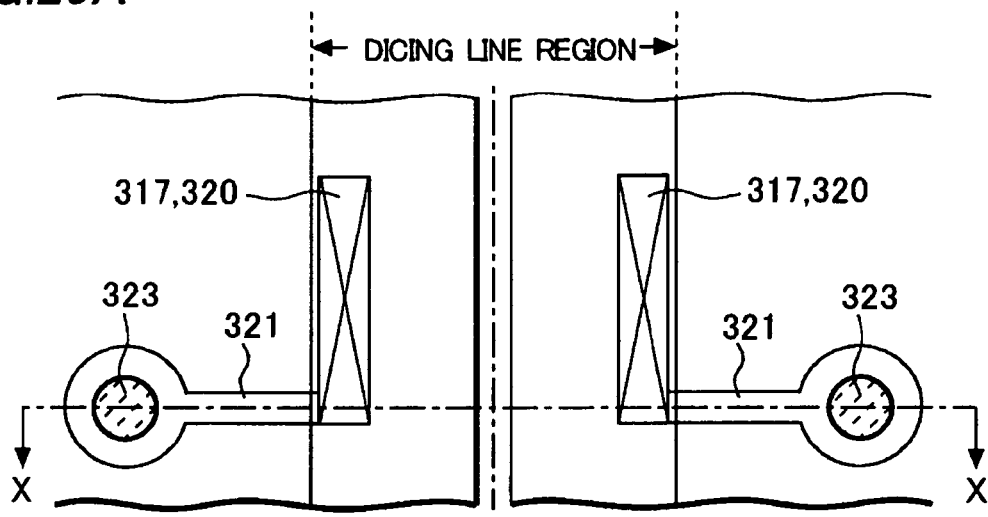
FIG. 29A is a plan view showing the semiconductor device and its manufacturing method according to the third embodiment of this invention.
Figure 29B:
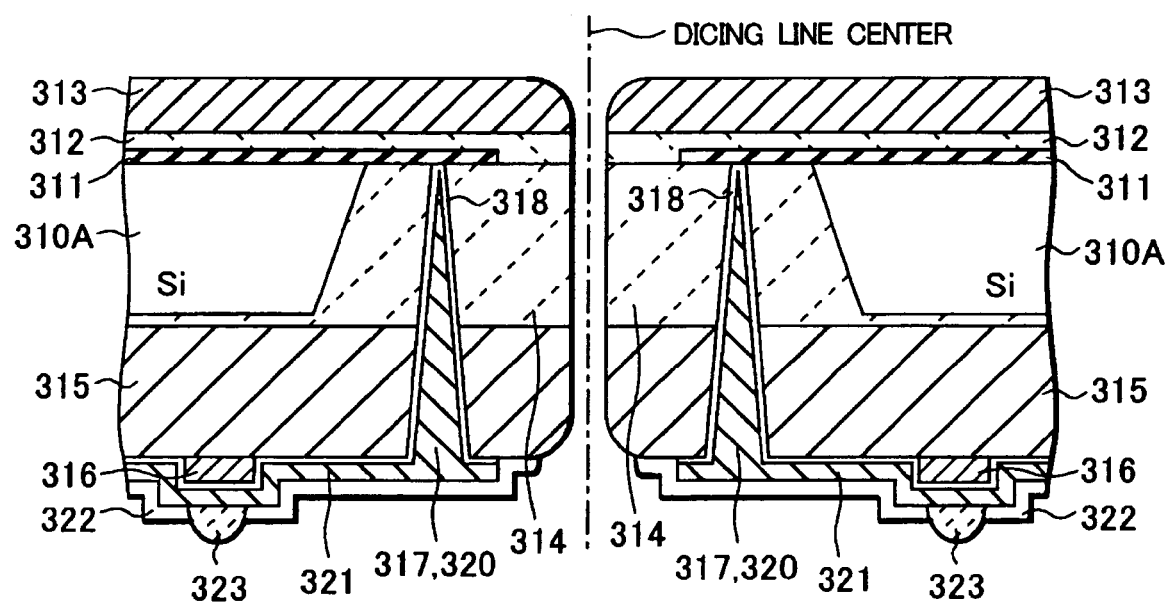
FIG. 29B is a cross-sectional view showing the semiconductor device and its manufacturing method according the third embodiment of this invention.
Figure 30A:
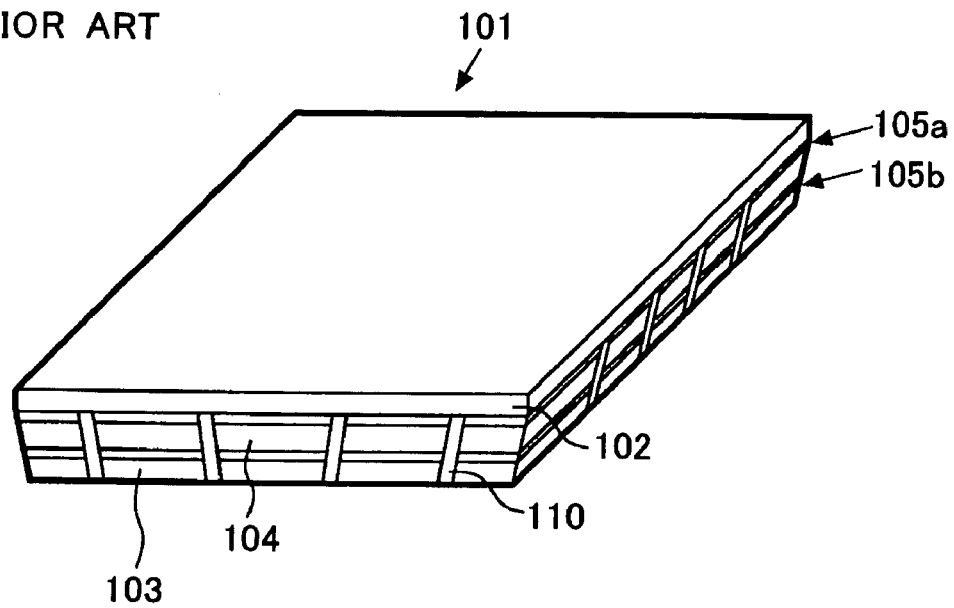
FIGS. 30A and 30B are a bird's eye view showing a semiconductor device according to the conventional art.
Figure 30B:
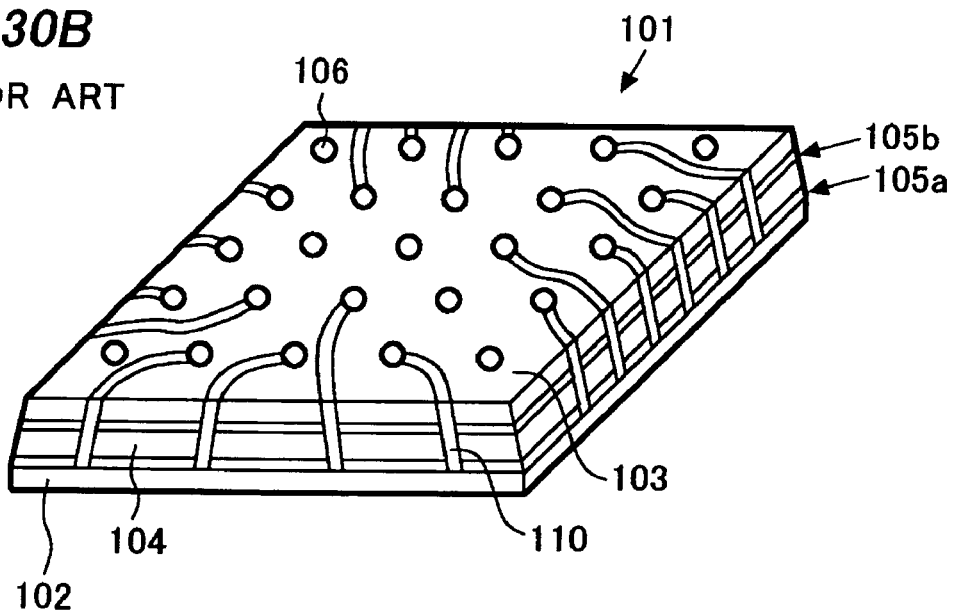
Figure 31:
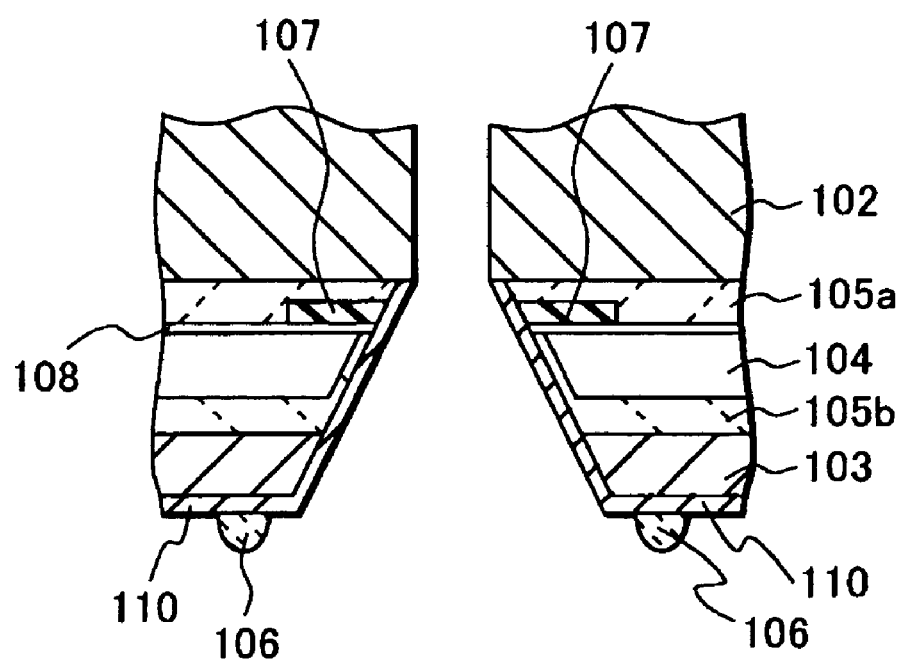
FIG. 31 is a cross-sectional view of the device of FIG. 31.

The via hole 317 is formed in a shape of straight well as shown in FIG. 28B. Not limited to that, the via hole 317 may be tapered down as the via hole 317 goes deeper from the surface of the second glass substrate 315, as shown in FIG. 29B. FIG. 29A is a plan view of the semiconductor device around the dicing line. FIG. 29B is a cross-sectional view showing a section X-X in FIG. 29A. The tapered via hole has an advantage that a seed layer 318 for plating may be formed by sputtering when forming the pillar-shaped conductive path 320 by plating, as will be described later.

Figure 20:
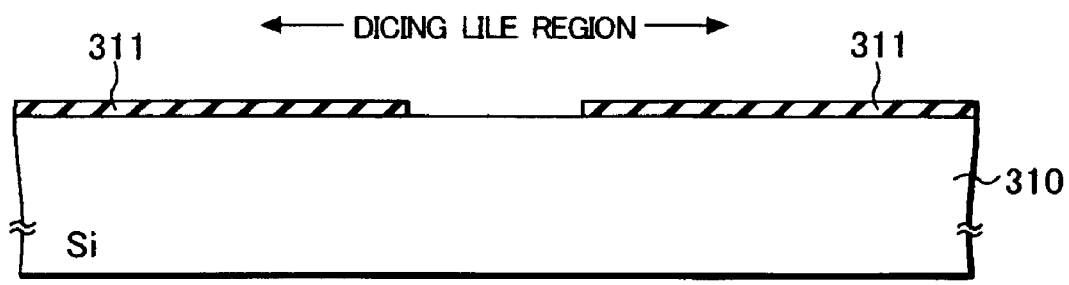
FIG. 20 is a cross-sectional view showing a manufacturing method of a semiconductor device according a third embodiment of this invention.

Next, a manufacturing method of the semiconductor device will be explained hereinafter. It is assumed that a semiconductor integrated circuit (a CCD image sensor, for example, not shown) is formed on a surface of the silicon wafer 310, as shown in FIG. 20. And the pad electrode 311, which is described above, is formed on the surface of the silicon wafer 310. The pad electrode 311 is made of aluminum, aluminum alloy or copper, and is about 1 μm thick.

Figure 21:
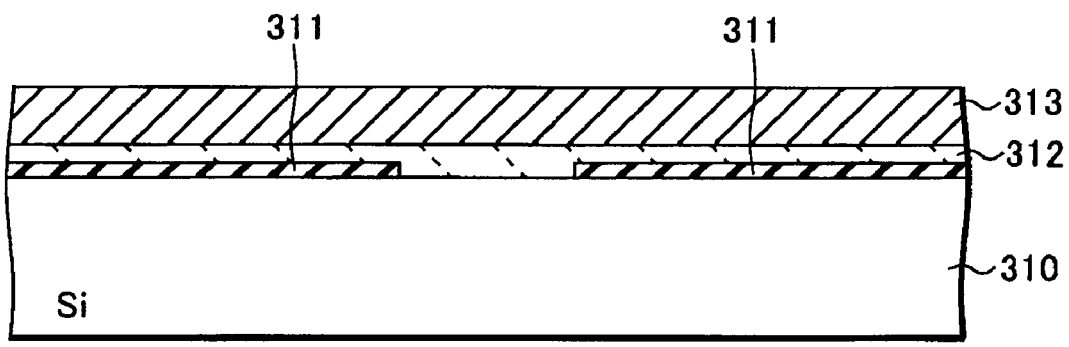
FIG. 21 is a cross-sectional view showing the manufacturing method of the semiconductor device according the third embodiment of this invention.

Next, as shown in FIG. 21, the first glass substrate 313 is bonded to the surface of the silicon wafer 310 through a resin layer 312 made of epoxy resin, for example. The first glass substrate 313 works as a material to protect and bolster the silicon wafer 310. After the first glass substrate 313 is bonded, thickness of the silicon wafer 310 is reduced to about 100 μm by back grinding. The ground surface may be further etched chemically to refine the surface. Or the back surface may be processed only by dry etching or by wet etching, without back grinding.

Figure 22:
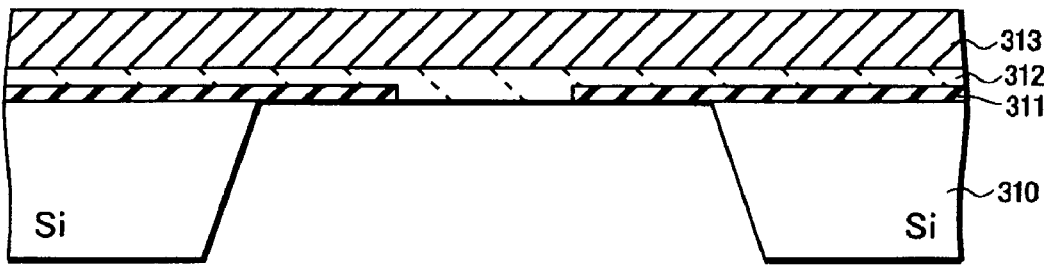
FIG. 22 is a cross-sectional view showing the manufacturing method of the semiconductor device according the third embodiment of this invention.

Then a part of the silicon wafer 310, which makes the dicing line region, is removed by etching, as shown in FIG. 22. In other words, the silicon wafer 310 is etched to expose a portion of the pad electrode 311. The etching is done by dry etching using a photoresist mask.

Figure 23:
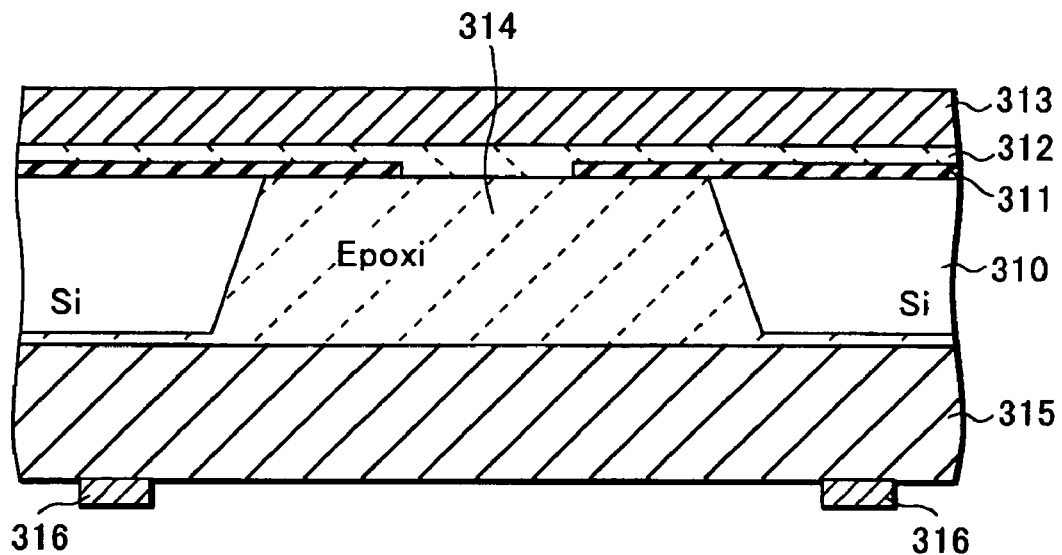
FIG. 23 is a cross-sectional view showing the manufacturing method of the semiconductor device according the third embodiment of this invention.

Next, as shown in FIG. 23, a resin layer 314 made of epoxy resin is applied to the back surface of the silicon wafer 310. Therewith the exposed portion of the pad electrode 311 and the side surface of the silicon wafer 310 exposed by the etching are covered with the resin layer 314. The second glass substrate 315 is bonded to the back surface of the silicon wafer 310, using the resin layer 314 as a binder. The second glass substrate 315 is about 100 μm thick. The second glass substrate 315 is to bolster the semiconductor device and make it more resistant to warping.

Furthermore, the cushioning material 316 is formed on the second glass substrate 315. The cushioning material 316 is formed at the location where the solder bump 323 is to be formed. The cushioning material 316 may be formed of photoresist material, an organic film or metal such as copper (Cu) by sputtering. The cushioning material 316 may be formed when it is required, or may be omitted when application of the semiconductor device does not require it.

Figure 24:
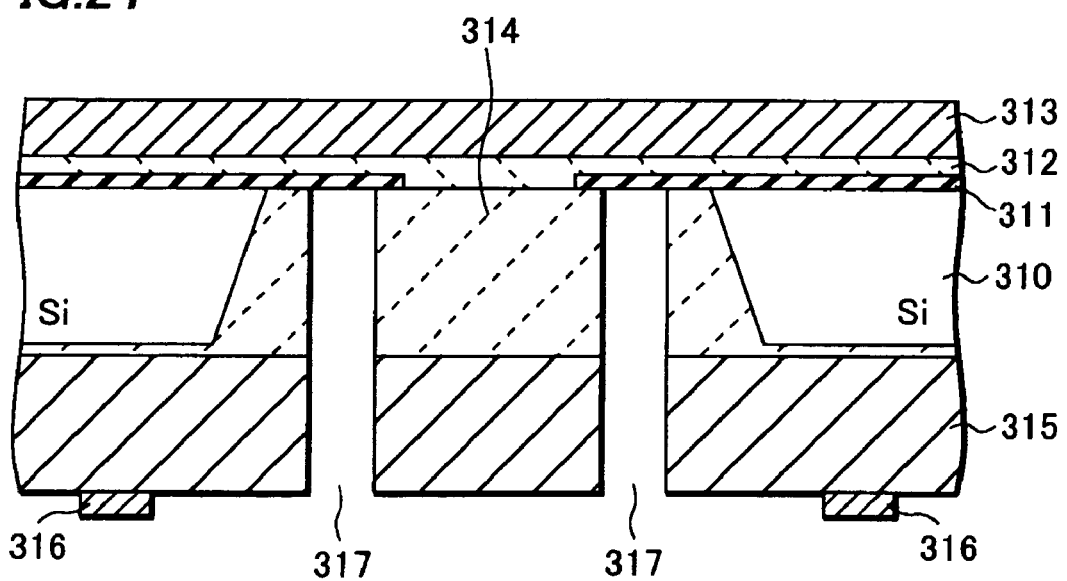
FIG. 24 is a cross-sectional view showing the manufacturing method of the semiconductor device according the third embodiment of this invention.
Figure 25:
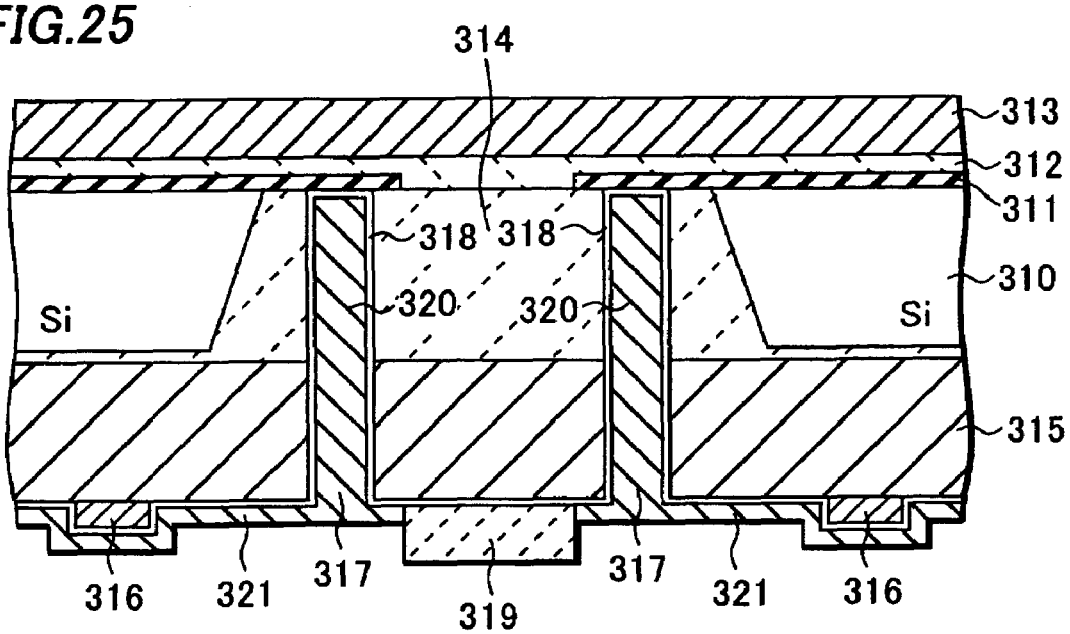
FIG. 25 is a cross-sectional view showing the manufacturing method of the semiconductor device according the third embodiment of this invention.
Figure 26:
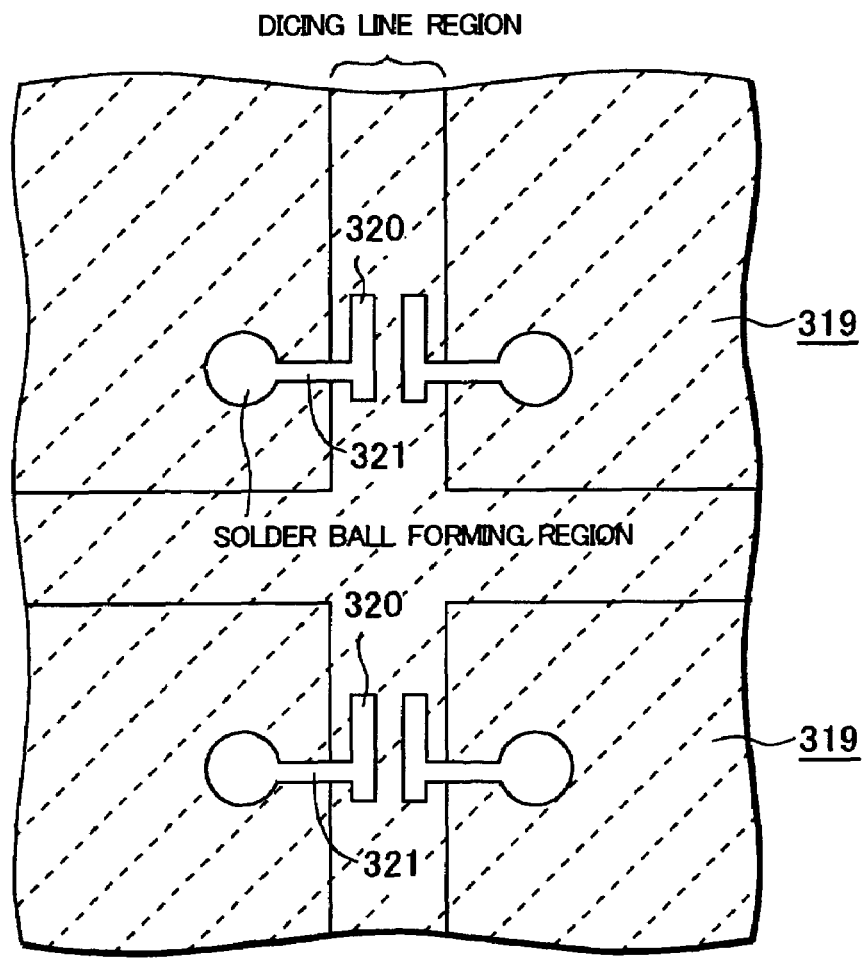
FIG. 26 is a plan view showing the manufacturing method of the semiconductor device according the third embodiment of this invention.
Figure 27:
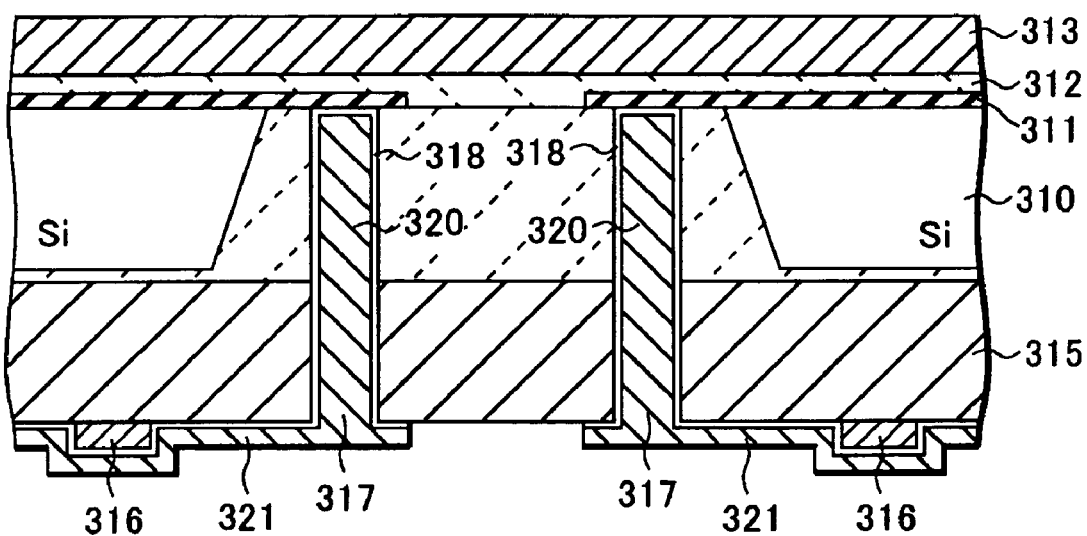
FIG. 27 is a cross-sectional view showing the manufacturing method of the semiconductor device according the third embodiment of this invention.

Next, the via hole 317, which penetrates the second glass substrate 315 and the resin layer 314 to reach a back surface of the pad electrode 311, is formed as shown in FIG. 24. Depth of the via hole 317 is about 200 μm. Its width is about 40 μm and its length is about 200 μm, for example. Using the laser beam is suitable to form the via hole 317, which is deep and penetrating a plurality of layers of different materials. If an etching method using dry etching or wet etching is adopted, each of the different materials composing a layer to be etched requires changing etching gas, complicating the manufacturing process. The via hole 317 may be formed to make a tapered shape as shown in FIG. 29B, by controlling the laser beam.

Then a seed layer 318 made of copper (Cu) is formed on the entire surface before forming the pillar-shaped conductive path 320 and the re-distribution layer 321. Since this process step and the rest of the process steps are the same as in the first embodiment, FIGS. 25-28B are presented omitting explanations.

Although the pillar-shaped conductive path (20, 220 or 320) is formed in the via hole (17, 217 or 317) by electrolytic plating in each of the embodiments described above, this invention is not limited to that, and other method may be used to form the pillar-shaped conductive path. For example, a method filling the via hole with metal such as aluminum, aluminum alloy or copper (Cu) by CVD (Chemical Vapor Deposition) or MOCVD (Metal Organic Chemical Vapor Deposition) may be used.

Also, the solder bump (23, 223 or 323) is formed on the re-distribution layer (21, 221 or 321) in each of the embodiments described above. However, this invention is not limited to that, and the solder bump (23, 223 or 323) may be formed on the pillar-shaped conductive path (20, 220 or 320) buried in the via hole (17, 217 or 317) without forming the re-distribution layer (21, 221 or 321) extended from the pillar-shaped conductive path (20, 220 or 320).

Furthermore, the pad electrode (11, 211 or 311) is made by extending a normal pad electrode used for wire bonding to the dicing line region in each of the embodiments described above. However, this invention is not limited to that, and the normal pad electrode used for wire bonding not extended to the dicing line region may be used instead of the pad electrode extended to the dicing line. In this case, only the location to form the via hole (17, 217 or 317) is required to be adjusted to the location of the normal pad, leaving other manufacturing process intact.

This invention is applied to a BGA type semiconductor device which has bump electrodes on the back surface of the semiconductor die in each of the embodiments described above. Not limited to that, these embodiments may also be applied to an LGA (Land Grid Array) type semiconductor device which does not have a bump electrode on its back surface. That is, the semiconductor device is formed to have the protection film (22, 222 or 322) on the re-distribution layer (21, 221 or 321), but not to have the solder bump (23, 223 or 323) in the opening of the protection film (22, 222 or 322). Or, the protection film (22, 222 or 322) may be formed to expose an end of the pillar-shaped conductive path (20, 220 or 320) buried in the via hole (17, 217 or 317), without forming the re-distribution layer (21, 221 or 321) and the solder bump (23, 223 or 323).

The disconnection, or the breaking, of the wiring between the pad electrode on the semiconductor die and the bump electrode on the back surface of the die and deterioration of step coverage can thus be prevented with these embodiments, leading to a BGA type semiconductor device of high reliability.

Also various semiconductor integrated circuit dice can be mounted on a mounting board with high density with this invention. In particular, when this invention is applied to an integrated circuit die of a CCD image sensor, the integrated circuit die can be mounted on a small mounting board for a small portable electronic apparatus such as a mobile phone.

What is claimed is:

1. A semiconductor device comprising:
    a semiconductor die comprising a top surface and a bottom surface;
    a pad electrode formed on the top surface of the semiconductor die and comprising a top face and a bottom face;
    a conductive pillar penetrating through the semiconductor die and being in contact with the bottom face of the pad electrode; and
    an insulating layer covering the entire top face of the pad electrode,
    wherein the conductive pillar comprises an insulating layer disposed on a sidewall of the conductive pillar, and
    there is no integrated circuit disposed over the top face of the pad electrode so as to be connected to the pad electrode.

2. The semiconductor device of claim 1, further comprising a bump electrode formed on the bottom surface of the semiconductor die and electrically connected with the conductive pillar.

3. The semiconductor device of claim 1, further comprising a re-distribution layer disposed on the back surface of the semiconductor die.

4. The semiconductor device of claim 2, further comprising a re-distribution layer disposed on the back surface of the semiconductor die and extending from the conductive pillar to the bump electrode.

5. The semiconductor device of claim 2, further comprising a cushioning material disposed on the back surface of the semiconductor die and beneath the bump electrode.

6. The semiconductor device of claim 1, wherein the conductive pillar comprises a tapered surface.

7. The semiconductor device of claim 1, wherein the insulating layer covering the top face of the pad electrode comprises a glass substrate covering the entire top face of the pad electrode.

8. The semiconductor device of claim 7, further comprising a resin layer attaching the glass substrate to the top face of the pad electrode.

9. The semiconductor device of claim 1, wherein the conductive pillar extends in plan view of the semiconductor device along a lateral edge of the semiconductor die in a direction perpendicular to the penetration of the conductive pillar.

10. The semiconductor device of claim 9, further comprising a re-distribution layer disposed on the back surface of the semiconductor die to extend in plan view of the semiconductor device in a direction perpendicular to the direction of the extension of the conductive pillar.

* * * * *